United States Patent
Wang et al.

(10) Patent No.: US 9,208,275 B2
(45) Date of Patent: Dec. 8, 2015

(54) METHODS FOR FABRICATING INTEGRATED CIRCUITS INCLUDING GENERATING PHOTOMASKS FOR DIRECTED SELF-ASSEMBLY

(71) Applicant: GLOBALFOUNDRIES, Inc., Grand Cayman (KY)

(72) Inventors: Wei-Long Wang, Clifton Park, NY (US); Azat Latypov, San Jose, CA (US); Yi Zou, Foster City, CA (US); Tamer Coskun, San Jose, CA (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 88 days.

(21) Appl. No.: 14/189,465

(22) Filed: Feb. 25, 2014

(65) Prior Publication Data

US 2015/0242555 A1 Aug. 27, 2015

(51) Int. Cl.
*G06F 17/50* (2006.01)
*G03F 1/00* (2012.01)
*H01L 21/027* (2006.01)
*H01L 21/311* (2006.01)

(52) U.S. Cl.
CPC ........ *G06F 17/5068* (2013.01); *G06F 17/5081* (2013.01); *H01L 21/0274* (2013.01); *H01L 21/31133* (2013.01)

(58) Field of Classification Search
CPC ............ G06F 17/5081; G06F 17/5068; H01L 21/0274; H01L 21/31133; G03F 1/70; G03F 1/36
See application file for complete search history.

(56) References Cited

U.S. PATENT DOCUMENTS

| | | | |
|---|---|---|---|
| 6,745,380 B2 | 6/2004 | Bodendorf et al. | |
| 7,237,221 B2 | 6/2007 | Granik et al. | |
| 7,861,207 B2 | 12/2010 | Word et al. | |
| 8,667,428 B1 * | 3/2014 | Latypov | 716/51 |
| 8,667,430 B1 * | 3/2014 | Latypov | 716/51 |
| 9,023,730 B1 * | 5/2015 | Latypov et al. | 438/694 |
| 2012/0005634 A1 | 1/2012 | Seltmann et al. | |
| 2012/0141924 A1 | 6/2012 | Sahouria | |
| 2012/0329289 A1 | 12/2012 | Fujimura et al. | |
| 2015/0012896 A1 * | 1/2015 | Latypov et al. | 716/55 |
| 2015/0012897 A1 * | 1/2015 | Latypov et al. | 716/55 |

OTHER PUBLICATIONS

U.S. Appl. No. 13/936,924, filed Jul. 8, 2013.
(Continued)

*Primary Examiner* — Brittany Raymond
(74) *Attorney, Agent, or Firm* — Ingrassia Fisher & Lorenz, P.C.

(57) ABSTRACT

Methods for fabricating integrated circuits are provided. In one example, a method for fabricating an integrated circuit includes generating a photomask for forming a DSA directing pattern overlying a semiconductor substrate. The DSA directing pattern is configured to guide a self-assembly material deposited thereon that undergoes directed self-assembly (DSA) to form a DSA pattern. Generating the photomask includes inputting DSA target patterns. The DSA target patterns are grouped into groups including a first group and a group boundary is defined around the first group as an initial OPC mask pattern. A circle target is generated around each of the DSA target patterns in the first group to define a merged circle target boundary. The initial OPC mask pattern is adjusted and/or iteratively updated using the merged circle target boundary to generate an output final OPC mask pattern.

20 Claims, 5 Drawing Sheets

(56) References Cited

OTHER PUBLICATIONS

Ji Xu, Introduction to Directed Self-Assembly (DSA) of Block Copolymer (BCP) in Thin Films, Jun. 29, 2011.

Azat Latypov, What is Directed Self-Assembly, Oct. 20, 2011.

Daniel J.C. Herr, Directed block copolymer self-assembly for nanoelectronics fabrication, J. Mater. Res., vol. 26, No. 2, Jan 28, 2011.

Michael B. Giles and Niles A. Pierce, "An Introduction to the Adjoint Approach to Design", Flow, Turbulence and Combustion, 65(3-4):393-415, 2000.

H.-S. Philip Wong et al, "Block copolymer directed self-assembly enables sub-lithographic patterning for device fabrication", an oral presentation at the SPIE Advanced Lithography 2012 Symposium, to be published in the SPIE Advanced Lithography 2012 conference proceedings.

H.-S. Philip Wong, "Directed Self-Assembly for the Semiconductor Industry", an oral presentation at GLOBALFOUNDRIES, Inc. Feb. 3, 2012.

Chi-Chun Liu et al, "Progress towards the integration of optical proximity correction and directed self-assembly of block copolymers with graphoepitaxy", an oral presentation at the SPIE Advanced Lithography 2012 Symposium, to be published in the SPIE Advanced Lithography 2012 conference proceedings.

Wikipedia contributors, "Copolymer", Wikipedia, The Free Encyclopedia, <http://en.wikipedia.org/w/index.php?title=Copolymer&oldid=457198836>. Oct. 24, 2011.

M. W. Matsen, Self-consistent field theory and its applications. In Soft Matter, vol. 1: Polymer Melts and Mixtures, Edited by G. Gompper and M. Schick (Wiley-VCH, Weinheim, 2006). ISBN: 3-527-30500-9, <http://www.personal.rdg.ac.uk/~sps96mwm/matsen_scft.pdf>.

Wikipedia contributors, "Penalty method", Wikipedia, The Free Encyclopedia, <http://en.wikipedia.org/w/index.php?&oldid=465609685>. Dec. 13, 2011.

Wikipedia contributors, "Gradient descent", Wikipedia, The Free Encyclopedia, <http://en.wikipedia.org/w/index.php?&oldid=486689439>. Apr. 10, 2012.

Wikipedia contributors, "Newton's method in optimization", Wikipedia, The Free Encyclopedia, <http://en.wikipedia.org/w/index.php?&oldid=480670839>. Mar. 7, 2012.

Wikipedia contributors, "Non-linear least squares", Wikipedia, The Free Encyclopedia, <http://en.wikipedia.org/w/index.php?&oldid=481409505>. Mar. 11, 2012.

Wikipedia contributors, "Gauss-Newton algorithm", Wikipedia, The Free Encyclopedia, <http://en.wikipedia.org/w/index.php?&oldid=478249186>. Feb. 22, 2012.

Wikipedia contributors, "Levenberg—Marquardt algorithm", Wikipedia, The Free Encyclopedia, <http://en.wikipedia.org/w/index.php?&oldid=486636602>. Apr. 10, 2012.

Wikipedia contributors, "Quasi-Newton method", Wikipedia, The Free Encyclopedia, <http://en.wikipedia.org/w/index.php?&oldid=483333808>. Mar. 22, 2012.

Wikipedia contributors, "Conjugate gradient method", Wikipedia, The Free Encyclopedia, <http://en.wikipedia.org/w/index.php?&oldid=487492827>. Apr. 15, 2012.

Austen G. Duffy "An Introduction to Gradient Computation by the Discrete Adjoint Method", Technical report, Florida State University (2009), <http://computationalmathematics.org/topics/files/adjoint-techreport.pdf>.

U.S. Appl. No. 13/936,910, filed Jul. 8, 2013.

U.S. Appl. No. 14/072,164, filed Nov. 5, 2013.

\* cited by examiner

METHODS FOR FABRICATING INTEGRATED CIRCUITS INCLUDING GENERATING PHOTOMASKS FOR DIRECTED SELF-ASSEMBLY

TECHNICAL FIELD

The technical field relates generally to methods for fabricating integrated circuits, and more particularly relates to methods for fabricating integrated circuits including generating photomasks for directed self-assembly.

BACKGROUND

Decreasing device size and increasing device density has traditionally been a high priority for the manufacturing of the integrated circuits. Optical lithography has been a driving force for device scaling. Conventional optical lithography is limited to about 80 nm pitch for single exposure patterning. While double and other multi-patterning processes can realize smaller pitch, these approaches are expensive and more complex.

Directed self-assembly (DSA), a technique that aligns self-assembling polymeric materials on a lithographically defined directing or guide pattern, is a potential option for extending current lithography beyond its pitch and resolution limits. The self-assembling materials, for example, are block copolymers (BCPs) that consist of a "A" homopolymer covalently attached to a "B" homopolymer, which are deposited over a lithographically defined directing pattern on a semiconductor substrate. The lithographically defined directing pattern is a pre-pattern (hereinafter "DSA directing pattern") that is encoded with spatial chemical and/or topographical information (e.g., chemical epitaxy and/or graphoepitaxy) and serves to direct the self-assembly process and the pattern formed by the self-assembling materials. Subsequently, by annealing the DSA polymers, the A polymer chains and the B polymer chains undergo phase separation to form an A polymer region and a B polymer region that are registered to the underlying DSA directing pattern to define a nanopattern (hereinafter "DSA pattern"). Then, by removing either the A polymer block or the B polymer block by wet chemical or plasma-etch techniques, a mask is formed for transferring the DSA pattern to the underlying semiconductor substrate.

Generating a photomask for lithographically defining the DSA directing pattern to accurately form the shape of the DSA pattern requires proper accounting of a multitude of physical effects that occur during the DSA process including from photomask writing on through to etching of the phase separated self-assembly materials to form the DSA pattern. For instance, a typical DSA process involves fabrication of a patterned photomask to be used to make the DSA directing pattern, exposing this photomask in a lithographic tool to photoresist that is disposed on a semiconductor substrate, developing and etching the exposed semiconductor substrate, processing the semiconductor substrate to create the DSA directing pattern, spin coating the pre-patterned semiconductor substrate with BCP, and annealing and etching the BCP to form the DSA pattern. Unfortunately, current approaches for generating a photomask for lithographically defining a DSA directing pattern to form a DSA pattern either do not fully account for the physical effects that occur during the DSA process, or if the approach does account for these physical effects, it uses numerical techniques that generally involve rigorous DSA simulations that consume significant computational time and can make DSA correction infeasible for even a medium size integrated circuit layout.

Accordingly, it is desirable to provide methods for fabricating integrated circuits including generating a photomask for lithographically defining a DSA directing pattern to accurately form a DSA pattern. Moreover, it is desirable to provide methods for fabricating integrated circuits including generating a photomask for lithographically defining a DSA directing pattern that more fully account for the physical effects that occur during a DSA process and that are practical for making DSA correction for various size integrated circuit layouts. Furthermore, other desirable features and characteristics of the present invention will become apparent from the subsequent detailed description and the appended claims, taken in conjunction with the accompanying drawings and this background.

BRIEF SUMMARY

Methods for fabricating integrated circuits are provided herein. In accordance with an exemplary embodiment, a method for fabricating an integrated circuit includes generating a photomask for forming a DSA directing pattern overlying a semiconductor substrate. The DSA directing pattern is configured to guide a self-assembly material deposited thereon that undergoes directed self-assembly (DSA) to form a DSA pattern. Generating the photomask includes, using a computing system, inputting a DSA target patterns. Using the computing system, the DSA target patterns are grouped into groups including a first group and a group boundary is defined around the first group as an initial OPC mask pattern. Using the computing system, a circle target is generated around each of the DSA target patterns in the first group to define a merged circle target boundary. Using the computing system, an OPC model, a DSA model, and the merged circle target boundary, the initial OPC mask pattern is adjusted and/or iteratively updated to generate an output final OPC mask pattern.

In accordance with another exemplary embodiment, a method for fabricating an integrated circuit is provided. The method includes generating a photomask for forming a DSA directing pattern overlying a semiconductor substrate. The DSA directing pattern is configured to guide a self-assembly material deposited thereon that undergoes directed self-assembly (DSA) to form a DSA pattern. Generating the photomask includes, using a computing system, inputting DSA target patterns. Using the computing system, the DSA target patterns are grouped into groups including a first group and a group boundary is defined around the first group as an initial OPC mask pattern. Using the computing system, the group boundary is fragmented to form a fragmented group boundary. Using the computing system, a circle target is generated around each of the DSA target patterns in the first group to define a merged circle target boundary. Using the computing system, an OPC model, and the merged circle target boundary, fragments of the fragmented group boundary are repositioned relative to each other to adjust the initial OPC mask pattern and form a first updated OPC mask pattern. Using the computing system, the OPC model, a DSA model, and the first updated OPC mask pattern, first simulated DSA patterns are generated. Using the computing system, edge placement errors correspondingly defined by differences between edge positions of the first simulated DSA patterns and the DSA target patterns are determined Using the computing system, determining if the edge placement errors are acceptable. If the edge placement errors are not acceptable, then adjusting the first updated OPC mask pattern based on the edge placement errors to generate a second updated OPC mask pattern.

In accordance with another exemplary embodiment, a method for fabricating an integrated circuit is provided. The method includes generating a photomask for forming a DSA directing pattern overlying a semiconductor substrate. The DSA directing pattern is configured to guide a self-assembly material deposited thereon that undergoes directed self-assembly (DSA) to form a DSA pattern. Generating the photomask includes, using a computing system, inputting DSA target patterns. Using the computing system, the DSA target patterns are grouped into groups including a first group and a group boundary is defined around the first group as an initial OPC mask pattern. Using the computing system, the group boundary is fragmented to form a fragmented group boundary. Using the computing system, a circle target is generated around each of the DSA target patterns in the first group to define a merged circle target boundary. Using the computing system, an OPC model, and the merged circle target boundary, fragments of the fragmented group boundary are repositioned relative to each other to adjust the initial OPC mask pattern and form a first updated OPC mask pattern. Using the computing system, the OPC model, a DSA model, and the first updated OPC mask pattern, the first updated OPC mask pattern is iteratively updated to generate a current iteration, updated OPC mask pattern and current iteration, simulated DSA patterns. Using the computing system, a root mean square of edge placement errors that are correspondingly defined by differences between edge positions of the current iteration, simulated DSA patterns and the DSA target patterns is determined Using the computing system, the root mean square of the edge placement errors is compared to a predetermined root mean square edge placement error value. If the root mean square of the edge placement errors is less than the predetermined root mean square edge placement error value, then the current iteration, updated OPC mask pattern is outputted.

BRIEF DESCRIPTION OF THE DRAWINGS

The various embodiments will hereinafter be described in conjunction with the following drawing figures, wherein like numerals denote like elements, and wherein.

DETAILED DESCRIPTION

The following Detailed Description is merely exemplary in nature and is not intended to limit the various embodiments or the application and uses thereof. Furthermore, there is no intention to be bound by any theory presented in the preceding background or the following detailed description.

Various embodiments contemplated herein relate to methods for fabricating integrated circuits. The exemplary embodiments taught herein generate a photomask for forming a DSA directing pattern overlying a semiconductor substrate. The DSA directing pattern is for guiding a self-assembly material (e.g., BCP) that is deposited on the DSA directing pattern and that undergoes directed self-assembly (DSA), e.g., phase separation during annealing, to form a DSA pattern. In an exemplary embodiment, the photomask is generated by inputting DSA target patterns into a computing system. The DSA target patterns are the desired or predetermined DSA patterns that are to be fabricated on the semiconductor substrate using the DSA process.

In an exemplary embodiment, the DSA target patterns are grouped into groups including a first group with a group boundary that is defined around the first group. In an exemplary embodiment, the group boundary has a predetermined polynomial shape (e.g., rectangle) with a predetermined size and may be selected, for example, from a database library. The group boundary is used as an initial optical proximity correction (OPC) mask pattern (e.g., initial mask pattern). A circle target (e.g., circle) having for example, a predetermined radius (R), is generated around each of the DSA target patterns in the first group. The circle targets may be relatively close so as to partially merge and the non-overlapping boundaries of the circle targets defines a merged circle target boundary. In an exemplary embodiment, the merged circle target boundary is defined using minimal computational time and without the use of DSA simulation.

In an exemplary embodiment, the initial OPC mask pattern is adjusted and/or iteratively updated to generate an output final OPC mask pattern using the computing system, an OPC (optical proximity correction) model, a DSA (or DSA PC—directed self-assembly process/proximity correction) model, and the merged circle target boundary. In an exemplary embodiment, the merged circular target boundary is used as an initial DSA directing pattern and the OPC model is applied to the initial DSA directing pattern to update the initial OPC mask pattern. The OPC model is used to simulate the patterns written on the semiconductor substrate given the patterns written on the photomask or vice versa taking into account the physical effects that occur during the exposure of the photoresist coated semiconductor substrate in the lithography tool and also in the development and etching of the exposed photoresist coated semiconductor substrate.

In an exemplary embodiment, output from the correction with the OPC model is input to the DSA model to generate a simulated DSA pattern. The DSA model is used to simulate the DSA fabricated pattern given the DSA directing pattern or vice versa taking into account the physical effects that occur during the DSA process including annealing and etching of the self-assembly material. In an exemplary embodiment, edge placement errors that are correspondingly defined by differences between the edge positions of the simulated DSA patterns and the DSA target patterns are determined. If the edge placement errors are acceptable, e.g., less than a predetermined value, then the updated OPC mask pattern from the OPC model is output as the output final OPC mask pattern. Alternatively, if the edge placement errors are not acceptable, e.g., greater than a predetermined value, then additional iterations cooperatively using the OPC and DSA models are conducted until, for example, the edge placement errors defined by differences between the edge positions of the current iteration, simulated DSA patterns and the DSA target patterns are acceptable. Then, the current iteration, updated OPC mask pattern is output as the output final OPC mask pattern.

The output final OPC mask pattern is written on the photomask to produce a patterned photomask. In an exemplary embodiment, because a multitude of physical effects that occur during the DSA process including from writing the photomask on through to etching of the phase separated self-assembly material have been accounted for in producing the output final OPC mask pattern, the patterned photomask can be used to lithographically define a DSA directing pattern that accurately forms the shape of the DSA pattern, e.g., target the DSA pattern. Moreover, in an exemplary embodiment, because the merged circle target boundary is used as an initial DSA directing pattern and is defined using minimal computational time and without the use of DSA simulation, less DSA simulation and computational time is needed to account for the multitude of physical effects during the DSA process, thereby making the DSA correction more feasible even for medium or larger size integrated circuit layouts compared to conventional approaches.

Figure 1:
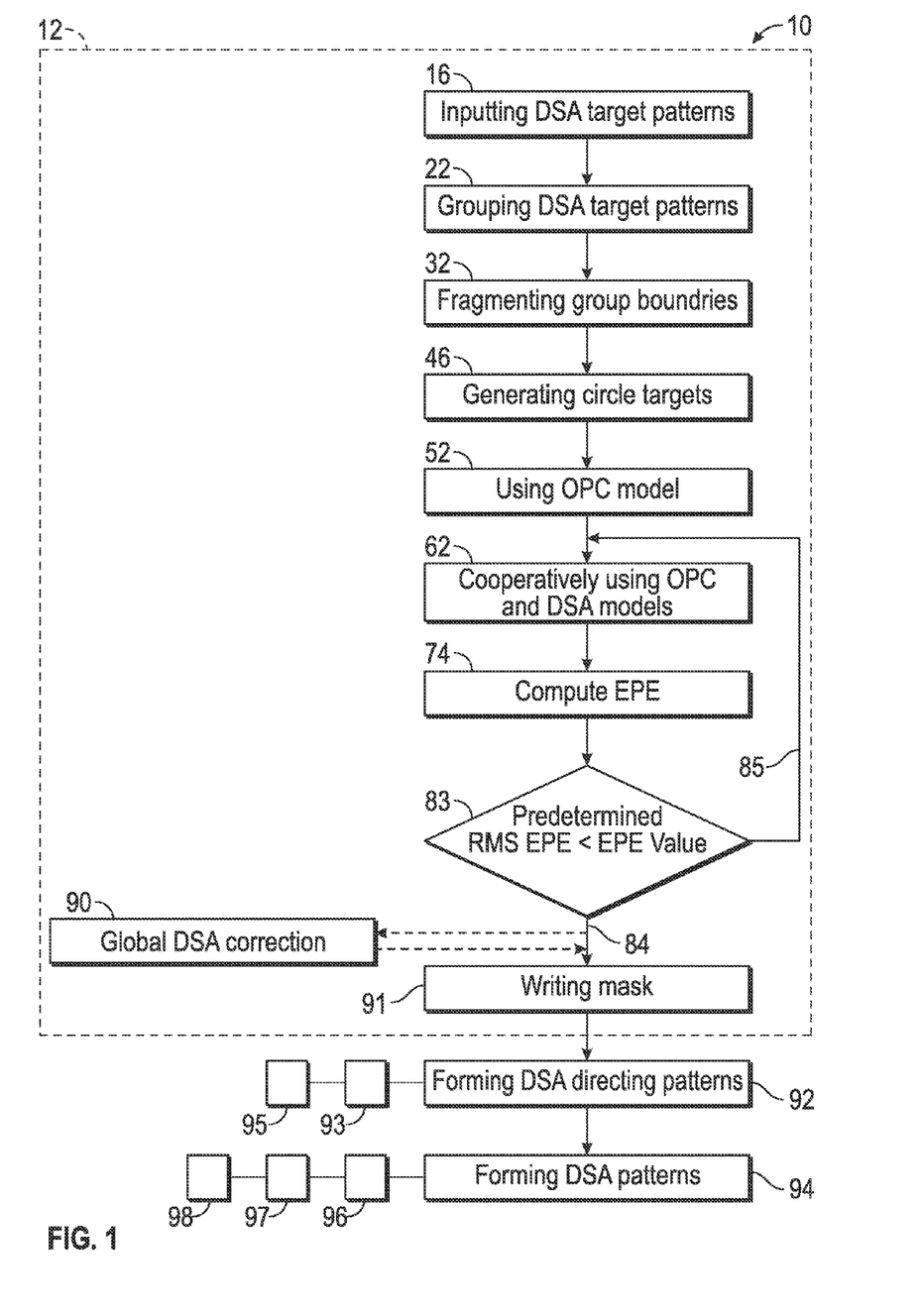
FIG. 1 is a block diagram of a method for fabricating an integrated circuit in accordance with an exemplary embodiment.

FIG. 1 is a block diagram of a method 10 for fabricating an integrated circuit (IC) in accordance with an exemplary embodiment. The described process steps, procedures, and materials are to be considered only as exemplary embodiments designed to illustrate to one of ordinary skill in the art methods for practicing the embodiments contemplated herein; the methods are not limited to these exemplary embodiments. Various steps in the manufacture of ICs are well known and so, in the interest of brevity, many conventional steps will only be mentioned briefly herein or will be omitted entirely without providing the well-known process details.

The method 10 includes generating a photomask (step 12) for forming a DSA directing pattern overlying a semiconductor substrate. The photomask may be, for example, an optical lithography photomask or an extreme ultraviolet (EUV) lithography photomask. The DSA directing pattern is for guiding a DSA material deposited on the DSA directing pattern during a DSA process in which the DSA material undergoes DSA (e.g., nano-size/scale phase separation that is registered to the DSA directing pattern) to form a DSA pattern.

Figure 2:
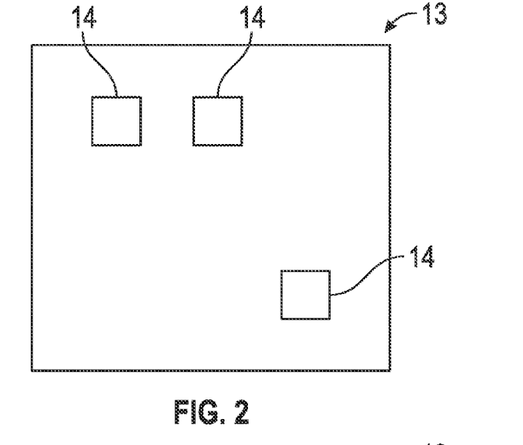
FIGS. 2-7 are schematic illustrations of a method for generating a photomask for fabricating an integrated circuit in accordance with an exemplary embodiment.

FIG. 2 is a DSA process layout simulation 13 in accordance with an exemplary embodiment. With reference to FIGS. 1-2, DSA target patterns 14 are input into a computing system (step 16). The term "DSA target patterns" is used herein to denote the patterns that are desired or predetermined to be fabricated on the semiconductor substrate using the DSA process. For instance, these patterns may include lines and spaces, isolated lines, contact holes, and other features, e.g., typically polygon type features needed for IC fabrication. The DSA target patterns 14 can be specified as a set of polygons or a set of smooth curves.

Figure 3:
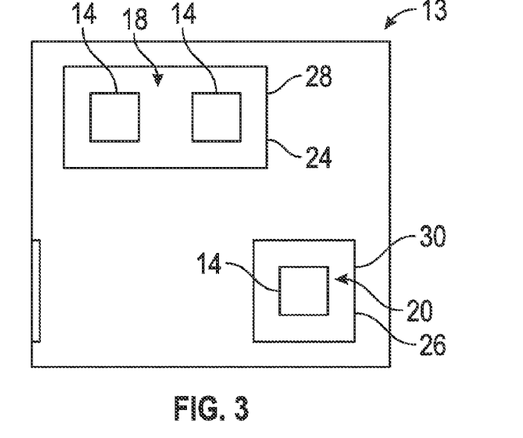

The method 10 continues as illustrated in FIGS. 1 and 3 by, using the computing system, grouping the DSA target patterns 14 into groups 18 and 20 (step 22) and defining group boundaries 24 and 26 correspondingly around the groups 18 and 20. The DSA target patterns 14 may be grouped using a set of design rules or predetermined templates from a database library that defines spacing requirements for whether or not a particular DSA target pattern(s) 14 is to be included in a specific group 18 or 20. Alternatively, other grouping techniques known to those skilled in the art may be used to group the DSA target patterns 14. In an exemplary embodiment, the group boundaries 24 and 26 are selected from a database library of predetermined polynomial shapes with predetermined sizes that are appropriately matched with the number and spacing of the DSA target patterns 14 in a particular group 18 or 20. The group boundaries 24 and 26 represent initial OPC mask patterns 28 and 30. The term "initial OPC mask patterns" is used herein to denote an initial approximation of photomask patterns for lithographically defining the DSA directing patterns (e.g., topographical features for graphoepitaxy DSA called confinement wells) for forming the DSA target patterns 14.

Figure 4:
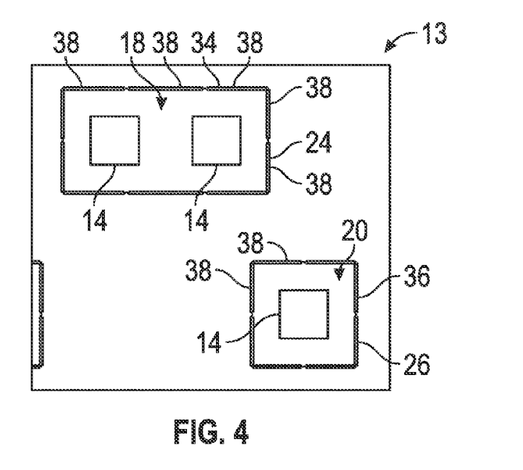

With reference to FIGS. 1 and 4, using the computing system, the group boundaries 24 and 26 are each fragmented (step 32) into fragmented group boundaries 34 and 36. In an exemplary embodiment, depending on the length of the side of the polynomial shaped pattern and the OPC process conditions, each side of the group boundaries 24 and 26 is fragmented or divided into 2, 3, or 4 fragments 38 each having substantially the same length as the other fragments 38 disposed along the same side of the corresponding group boundary 24 or 26 or alternatively, some or all of the fragments 38 can have different lengths than the other fragments disposed along the same side of the corresponding group boundary 24 or 26. Alternatively, the group boundaries 24 and 26 may be fragmented using other fragmentation techniques known to those skilled in the art.

Figure 5:
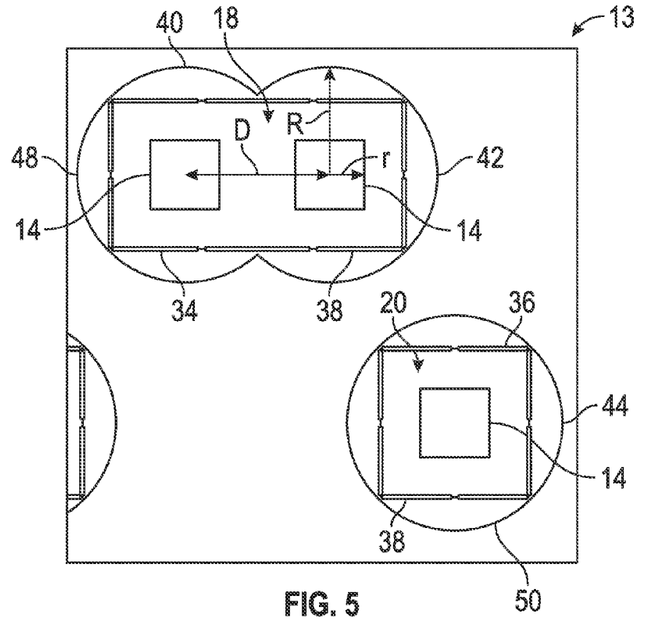

The method 10 continues as illustrated in FIGS. 1 and 5 by, using the computing system, generating circle targets 40, 42, and 44 correspondingly around the DSA targets 14 (step 46). In an exemplary embodiment, the circle targets 40, 42, and 44 are each defined by a circle with a radius (indicated by single headed arrow "R") originating from the center of the corresponding DSA target pattern 14. In an exemplary embodiment, the radius (R) is defined by the following relationship derived from geometry calculation:

$$\pi R^2 - (R^2 \arccos(D/(2R)) - D(R^2 - D^2/4)^{1/2}/2) = \pi r^2/f,$$

where r is an effective radius (indicated by single headed arrow "r") from a center of a particular DSA target pattern 14 in the group 18 or 20 to an edge of the particular DSA target pattern 14, D is a distance (indicated by double headed arrow "D") from a center of the particular DSA target pattern 14 to a center of an adjacent DSA target pattern 14 that is in the same group 18 or 20, and f is a constant associated with a DSA threshold and fraction ratio of a minority phase of the self-assembly material intended to be subsequently used in the DSA process. In particular, f is depended upon the particular self-assembly material and can be determined via simulation using a DSA model as will be discussed in further detail below. In an exemplary embodiment, the radius (R) of the circle targets 42, 44, and/or 46 is from about 30 to about 50 nm and may be a predetermined radius that is selected from a database library.

In an exemplary embodiment and as illustrated, the circle targets 40 and 42 of the group 18 are partially merged such that the non-overlapping boundaries of the circle targets 40 and 42 define a merged circle target boundary 48. Alternatively and as illustrated, the group 20 contains only a single DSA target pattern 14 and as such, the entire circle that defines the circle target 44 is non-overlapping because it does not overlap with any adjacent circle targets. As such, the single circle target 44 defines a merged circle target boundary 50. In an exemplary embodiment, the merged circle target boundaries 48 and 50 are used as initial DSA directing patterns and are defined using minimal computational time and without the use of a DSA model simulation. The term "initial DSA directing patterns" is used herein to denote an initial approximation of the DSA directing patterns (e.g., confinement wells) for forming the DSA target patterns.

Figure 6:
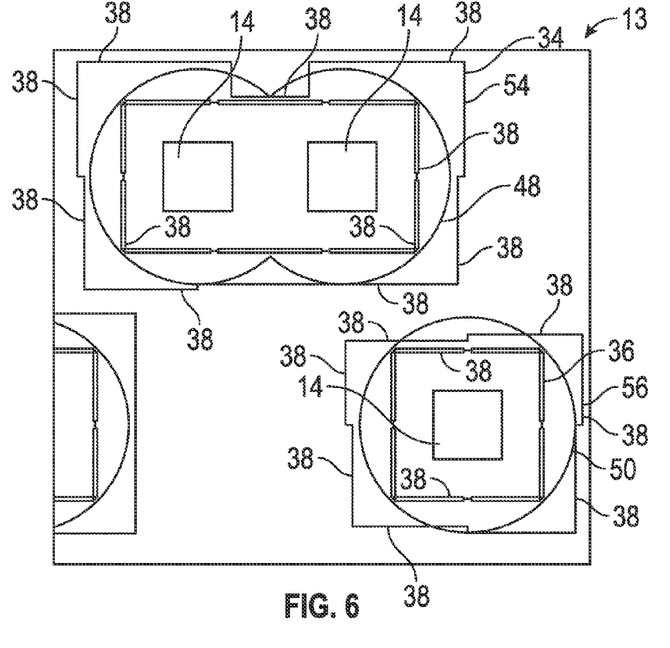

With reference to FIGS. 1 and 6, using the computing system, an OPC model, and the merged circle target boundaries 48 and 50, the fragments 38 of the fragmented group boundaries 34 and 36 are repositioned relative to each other (step 52) to adjust the initial OPC mask patterns and form updated OPC mask patterns 54 and 56 (note—the updated OPC mask patterns 54 and 56 can be lithographically printed to produce the merged circle target boundaries 48 and 50). As discussed above, the OPC model is used to simulate the patterns written on the semiconductor substrate given the patterns written on the photomask or vice versa taking into account the physical effects that occur during the exposure of the photoresist coated semiconductor substrate in the lithography tool and also in the development and etching of the exposed photoresist coated semiconductor substrate. Various OPC models are commercially available and are typically used by photomask manufacturers for the development and finalization of photomask designs. These OPC models are calibrated with wafer data that can predict with the graphical printing images accurately. Several models are adopted in current photomask data preparation such as Resist-3-D OPC Model, High-Speed Compact OPC Model, Mask 3-D OPC Model, and the like. In an exemplary embodiment, the OPC model takes as an input the merged circle target boundary 48 and as a separate input the merged circle target boundary 50 as the patterns to be written on the semiconductor substrate (e.g. confinement wells) and simulates and corrects the corresponding patterns written on the photomask to form the updated OPC mask patterns 54 and 56.

Figure 7:
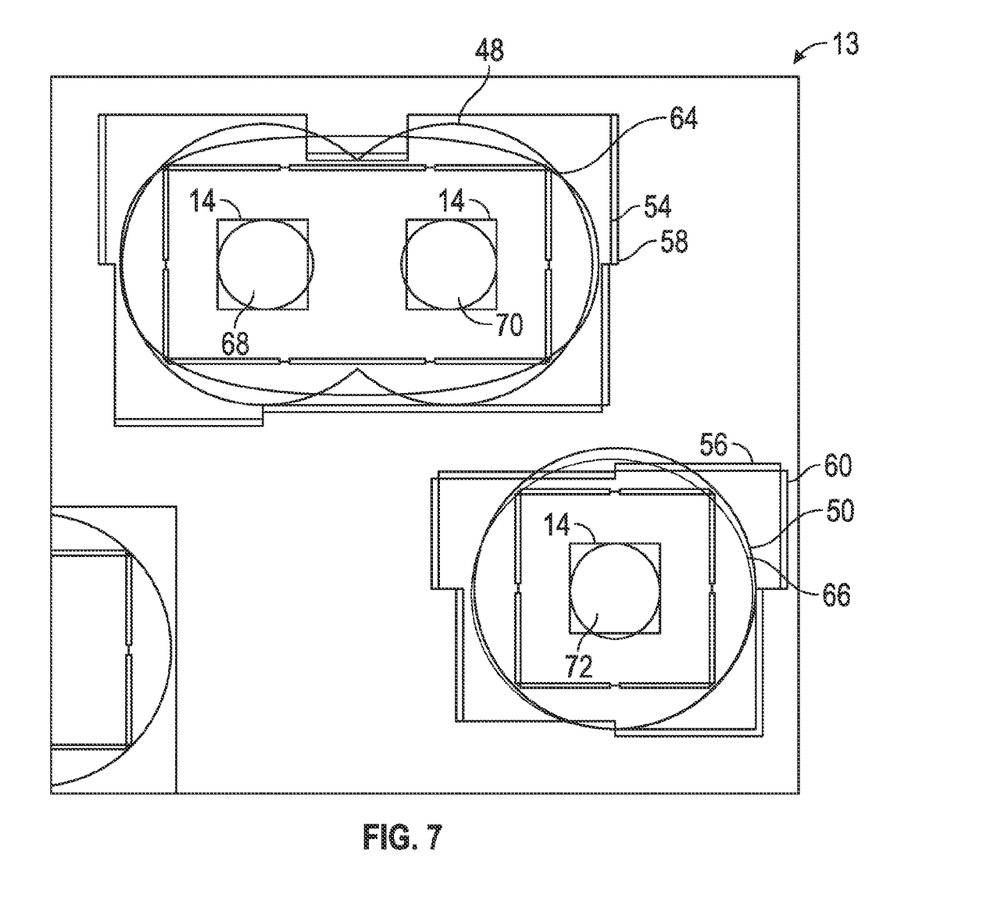

With reference to FIGS. 1 and 7, using the computing system, the OPC model, a DSA model, and the updated OPC mask patterns 54 and 56, current iteration, updated OPC mask patterns 58 and 60 are generated (step 62). As discussed above, the DSA model is used to simulate the DSA fabricated pattern given the DSA directing pattern or vice versa taking into account the physical effects that occur during the DSA process including annealing and etching of the self-assembly material. Various DSA models, such as Monde-Carlo-Baesd, SCFT-Based, and Fast-Compacted DSA models, are available for use in developing and finalizing DSA processes.

In an exemplary embodiment, the current iteration, updated OPC mask patterns 58 and 60 are generated by applying the OPC correction globally to generate the updated OPC mask pattern 54 and the updated OPC mask pattern 56 to correspondingly generate current iteration, DSA directing patterns 64 and 66 (e.g., confinement well patterns). Next, the DSA model takes as separate inputs the current iteration, DSA directing pattern 64 and the current iteration, DSA directing pattern 66 to correspondingly generate current iteration, simulated DSA patterns 68, 70, and 72.

Figure 8:
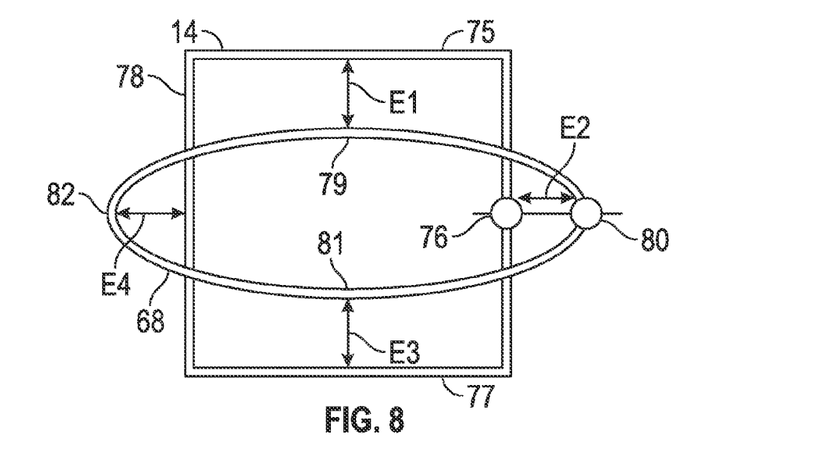
FIG. 8 is an enlarged view of a DSA target pattern and a simulated DSA pattern illustrated in FIG. 7.

With reference to FIGS. 1 and 7-8, in an exemplary embodiment, edge placement errors (EPE) are computed (step 74) by determining the differences (indicated by double headed arrows E1, E2, E3, and E4) correspondingly between the edge positions 75, 76, 77, 78, 79, 80, 81, and 82 of the current iteration, simulated DSA patterns 68, 70, and 72 and the DSA target patterns 14. If the edge placement errors are acceptable (e.g., relatively small), the current iteration, updated OPC mask patterns 58 and 60 are output as the output final OPC mask patterns. In an exemplary embodiment, a root mean square of edge placement errors are calculated and compared to a predetermined root mean square edge placement error value (step 83). If the root mean square of the edge placement errors is less than or equal to the predetermined root mean square edge placement error value, then the edge placement errors are acceptable and the current iteration, updated OPC mask patterns 58 and 60 are outputted (indicated by line 84). Alternatively, if the root mean square of the edge placement errors is greater than the predetermined root mean squared edge placement error value, then the edge placement errors are not acceptable and the current iteration, updated OPC mask patterns 58 and 60 are input to an iterative loop 85 for additional iterations cooperatively using the OPC and DSA models to further update the OPC mask patterns until, for example, the edge placement errors are acceptable (e.g., the root mean square of the edge placement errors is less than or equal to the predetermined root mean square edge placement error value) or until a predetermined number of iterations have been conducted. Then, the current iteration, updated OPC mask patterns 58 and 60 are output as the output final OPC mask patterns via line 84. Other approaches known to those skilled in the art for determining if the edge placement errors are acceptable are not may also be used, such as, for example, a weighting-based root mean squared edge placement error approach, comparing the edge placement errors individually or collectively to predetermined values, or the like.

Referring to FIG. 1, to account for the synergistic optical interactions between the output final OPC mask patterns during lithographic transfer of the patterns from the photomask to a photoresist layer, optionally the output final OPC mask patterns may be globally adjusted (Global Adjustment on DSA Correction or Global DSA Correction) by, using the computing system, cooperatively applying the OPC and DSA models to the output final OPC mask patterns to generate globally adjusted output final OPC mask patterns (step 90). In an exemplary embodiment, the output final OPC mask patterns are globally adjusted by cooperatively applying the OPC and DSA models to the output final OPC mask patterns together (rather than individually) for a single or multiple iterations. This is global adjustment on the final OPC mask is to improve the correction accuracy around close groups that have strong correction interaction with respect to DSA and OPC simulation.

The method 10 continues by communicating the output final OPC mask patterns, e.g., current iteration, updated OPC mask patterns 58 and 60 or globally adjusted output final OPC mask patterns, to a mask writer and writing on the photomask (step 91) to produce a patterned photomask. Because a multitude of physical effects of the DSA process have been accounted for in defining the output final OPC mask patterns, the patterned photomask can be used to lithographically define a DSA directing pattern that accurately forms the shape of the DSA pattern.

The method 10 continues by forming the DSA directing pattern overlying a semiconductor substrate (step 92). Forming the DSA directing pattern (step 92) includes patterning a photoresist layer (step 93) that overlies the semiconductor substrate 95 using the patterned photomask. In an exemplary embodiment, the photoresist layer can be patterned with the patterned photomask using well known optical or EUV lithographic techniques. In one embodiment, the photoresist layer is patterned for forming the DSA directing pattern having a graphoepitaxy surface as is known in the art. In an exemplary embodiment, the graphoepitaxy surface includes confinement wells that define pre-pattern openings.

The method 10 continues by forming the DSA pattern (step 94). In an exemplary embodiment, the DSA pattern is formed (step 94) by depositing a self-assembly material (BCP) on the graphoepitaxy surface including into the pre-pattern opening (step 96). In an exemplary embodiment, the self-assembly material is a block copolymer. Non-limiting examples of block copolymers include polystyrene-block-polymethylmethacrylate (PS-b-PMMA), polystyrene-block-polybutadiene (PS-b-PB), polystyrene-block-poly(2-vinyl pyridine (PS-b-P2VP), polystyrene-block-polydimethylsiloxane (OS-b-PDMS), and polystyrene-block-polyethylene oxide (PS-b-PEO). The self-assembly material is then annealed (step 97) and etched (step 98) to define the DSA pattern. The self-assembly material may be deposited, annealed, and etched as described above using well known techniques. In an exemplary embodiment, the self-assembly material is deposited using a spin coating process, is annealed at a temperature of from about 125 to about 350° C. for a time from 1 minute to about 24 hours, and is etched using a dry etching process, e.g., a plasma etching process.

Figure 9:
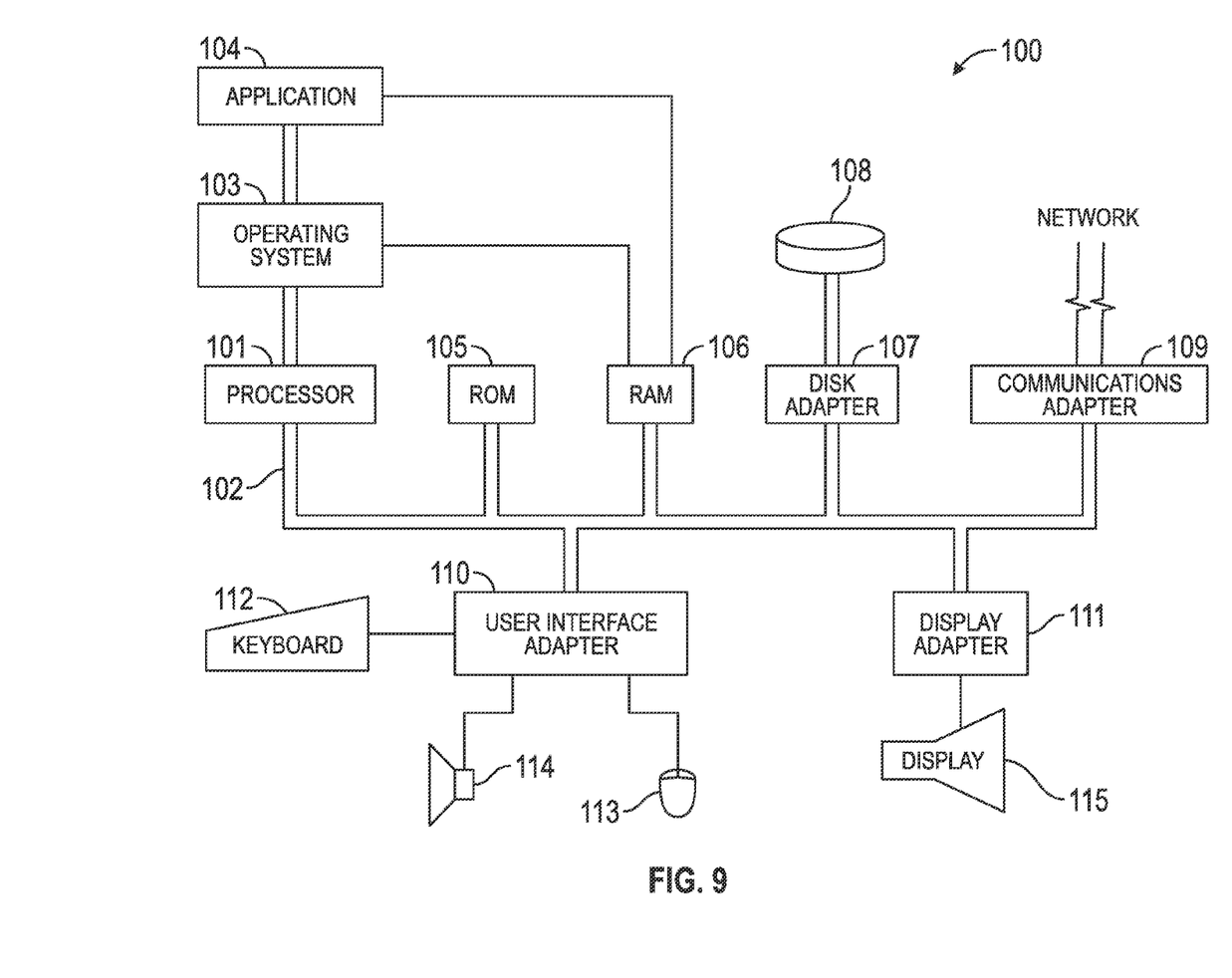
FIG. 9 is a schematic illustration of a computing system arranged in accordance with an exemplary embodiment.

FIG. 9 is a schematic illustration of a block diagram of a computing system 100 arranged in accordance with an exemplary embodiment. The various embodiments disclosed herein can be implemented on the computing system 100. The computing system 100 is also representative of a hardware environment for the present disclosure. For example, the computing system 100 may have a processor 101 coupled to various other components by a system bus 102.

An operating system 103 may run on the processor 101 and provide control and coordinate the functions of the various components of FIG. 9. An application 104 in accordance with the principles of examples of the present disclosure may execute in conjunction with the operating system 103 and provide calls and/or instructions to the operating system 103 where the calls/instructions implement the various functions or services to be performed by the application 104.

A read-only memory ("ROM") 105 may be coupled to a system bus 102 and can include a basic input/output system ("BIOS") that can control certain basic functions of the computing system 100. A random access memory ("RAM") 106 and a disk adapter 107 may also be coupled to system bus 102. It should be noted that software components, including the operating system 103 and the application 104, may be loaded into a RAM 106, which may be computing system's main memory for execution. The disk adapter 107 may be provided which can be an integrated drive electronics ("IDE") or parallel advanced technology attachment ("PATA") adapter, a serial advanced technology attachment ("SATA") adapter, a small computer system interface ("SCSI") adapter, a universal serial bus ("USB") adapter, an IEEE 1394 adaptor, or any other appropriate adapter that communicates with a disk unit 108, e.g., disk drive.

The computing system 100 may further include a communications adapter 109 coupled to the system bus 102. The communications adapter 109 may interconnect the system bus 102 with an external network (not shown) thereby facilitating the computing system 100 to communicate with other similar and/or different devices.

Input/Output ("I/O") devices may also be connected to the computing system 100 via a user interface adapter 110 and a display adapter 111. For example, a keyboard 112, a mouse 113, and a speaker 114 may be interconnected to the system bus 102 through the user interface adapter 110. Data may be provided to the computing system 100 through any of these example devices. A display monitor 115 may be connected to the system bus 102 by any display adapter 111. In this example manner, a user can provide data or other information to the computing system 100 through the keyboard 112 and/or the mouse 113, and obtain output from the computing system 100 via the display 115 and/or the speaker 114.

Accordingly, methods for fabricating integrated circuits including generating photomasks for directed self-assembly have been described.

While at least one exemplary embodiment has been presented in the foregoing detailed description of the disclosure, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing an exemplary embodiment of the disclosure. It being understood that various changes may be made in the function and arrangement of elements described in an exemplary embodiment without departing from the scope of the disclosure as set forth in the appended claims.

What is claimed is:

1. A method for fabricating an integrated circuit comprising:
generating a photomask for forming a DSA directing pattern overlying a semiconductor substrate, wherein the DSA directing pattern is configured to guide a self-assembly material deposited thereon that undergoes directed self-assembly (DSA) to form a DSA pattern, and wherein generating the photomask comprises:
using a computing system, inputting DSA target patterns;
using the computing system, grouping the DSA target patterns into groups including a first group and defining a group boundary around the first group as an initial OPC mask pattern;
using the computing system, generating a circle target around each of the DSA target patterns in the first group to define a merged circle target boundary; and
using the computing system, an OPC model, a DSA model, and the merged circle target boundary, adjusting and/or iteratively updating the initial OPC mask pattern to generate an output final OPC mask pattern.

2. The method of claim 1, wherein inputting the DSA target patterns comprises inputting a line and space pattern, an isolated line pattern, a contact hole pattern, and/or other polygon pattern.

3. The method of claim 1, wherein grouping the DSA target patterns comprises defining the group boundary having a predetermined polynomial shape with a predetermined size.

4. The method of claim 1, wherein generating the circle target comprises generating the circle target around a particular DSA target pattern, wherein the circle target has radius (R) defined by a relationship as follows:

$$\pi R^2 - (R^2 \arccos(D/(2R)) - D(R^2 - D^2/4)^{1/2}/2) = \pi r^2/f,$$

wherein r is an effective radius of a first center of the particular DSA target pattern in the first group to an edge of the particular DSA target pattern, D is a distance from the first center of the particular DSA target pattern to a second center of an adjacent DSA target pattern that is in the first group, and f is a constant associated with a DSA threshold and fraction ratio of a minority phase of the self-assembly material.

5. The method of claim 1, wherein generating the circle target comprises generating the circle target having a radius (R) of from about 30 to about 50 nm around each of the DSA target patterns in the first group.

6. The method of claim 1, further comprising:
using the computing system, fragmenting the group boundary to form a fragmented group boundary, and wherein using the computing system, the OPC model, the DSA model, and the merged circle target boundary comprises:
using the computing system, the OPC model, and the merged circle target boundary, repositioning fragments of the fragmented group boundary relative to each other to adjust the initial OPC mask pattern and form a first updated OPC mask pattern; and
using the computing system, the OPC model, the DSA model, and the first updated OPC mask pattern, iteratively updating the first updated OPC mask pattern to generate the output final OPC mask pattern.

7. The method of claim 6, wherein grouping the DSA target patterns comprising defining the group boundary having a polynomial shaped pattern, and wherein fragmenting comprises fragmenting each side of the polynomial shaped pattern into 2, 3, or 4 fragments.

8. The method of claim 1, wherein grouping the DSA target patterns comprises using the computing system, grouping the DSA target patterns into the groups including an additional group and defining an additional group boundary around the additional group as an additional initial OPC mask pattern, and wherein the method further comprises:
 using the computing system, generating an additional circle target around each of the DSA target patterns in the additional group to define an additional merged circle target boundary; and
 using the computing system, the OPC model, the DSA model, and the additional merged circle target boundary, adjusting and/or iteratively updating the additional initial OPC mask pattern to generate an additional output final OPC mask pattern.

9. The method of claim 8, further comprising:
 using the computing system, the OPC model, and the DSA model, cooperatively adjusting the output final OPC mask pattern and the additional output final OPC mask pattern via Global DSA correction to generate globally adjusted output final OPC mask patterns.

10. The method of claim 1, wherein generating the photomask comprises generating an optical lithography photomask.

11. The method of claim 1, wherein generating the photomask comprises generating an EUV lithography photomask.

12. The method of claim 11, further comprising:
 patterning a photoresist layer overlying the semiconductor substrate using the photomask.

13. The method of claim 12, wherein patterning the photoresist layer comprises patterning the photoresist layer to form the DSA directing pattern having a graphoepitaxy surface that defines a pre-pattern opening.

14. The method of claim 13, further comprising depositing the self-assembly material on the graphoepitaxy surface including into the pre-pattern opening.

15. The method of claim 14, further comprising phase separating the self-assembly material to define the DSA pattern.

16. The method of claim 15, further comprising etching the DSA pattern to form a mask for transferring the DSA pattern to the semiconductor substrate.

17. A method for fabricating an integrated circuit comprising:
 generating a photomask for forming a DSA directing pattern overlying a semiconductor substrate, wherein the DSA directing pattern is configured to guide a self-assembly material deposited thereon that undergoes directed self-assembly (DSA) to form a DSA pattern, and wherein generating the photomask comprises:
  using a computing system, inputting DSA target patterns;
  using the computing system, grouping the DSA target patterns into groups including a first group and defining a group boundary around the first group as an initial OPC mask pattern;
  using the computing system, fragmenting the group boundary to form a fragmented group boundary;
  using the computing system, generating a circle target around each of the DSA target patterns in the first group to define a merged circle target boundary;
  using the computing system, an OPC model, and the merged circle target boundary, repositioning fragments of the fragmented group boundary relative to each other to adjust the initial OPC mask pattern and form a first updated OPC mask pattern;
  using the computing system, the OPC model, a DSA model, and the first updated OPC mask pattern, generating first simulated DSA patterns;
  using the computing system, determining edge placement errors correspondingly defined by differences between edge positions of the first simulated DSA patterns and the DSA target patterns; and
  using the computing system, determining if the edge placement errors are acceptable, and wherein if the edge placement errors are not acceptable, then adjusting the first updated OPC mask pattern based on the edge placement errors to generate a second updated OPC mask pattern.

18. The method of claim 17, wherein using the OPC and DSA models, determining the edge placement errors, and determining if the edge placement errors are acceptable cooperate to define an iterative loop, and wherein the method further comprises:
 using the computing system, inputting the second updated OPC mask pattern to the iterative loop to iteratively apply the OPC and DSA models to generate a current iteration, updated OPC mask pattern and correspondingly current iteration edge placement errors that are acceptable; and
 using the computing system, outputting the current iteration, updated OPC mask pattern from the iterative loop.

19. The method of claim 17, wherein using the OPC and DSA models, determining the edge placement errors, and determining if the edge placement errors are acceptable cooperate to define an iterative loop, and wherein the method further comprises:
 using the computing system, inputting the second updated OPC mask pattern to the iterative loop to iteratively apply the OPC and DSA models for a predetermined number of iterations to generate a current iteration, updated OPC mask pattern; and
 using the computing system, outputting the current iteration, updated OPC mask pattern from the iterative loop.

20. A method for fabricating an integrated circuit comprising:
 generating a photomask for forming a DSA directing pattern overlying a semiconductor substrate, wherein the DSA directing pattern is configured to guide a self-assembly material deposited thereon that undergoes directed self-assembly (DSA) to form a DSA pattern, and wherein generating the photomask comprises:
  using a computing system, inputting DSA target patterns;
  using the computing system, grouping the DSA target patterns into groups including a first group and defining a group boundary around the first group as an initial OPC mask pattern;
  using the computing system, fragmenting the group boundary to form a fragmented group boundary;
  using the computing system, generating a circle target around each of the DSA target patterns in the first group to define a merged circle target boundary;
  using the computing system, an OPC model, and the merged circle target boundary, repositioning fragments of the fragmented group boundary relative to each other to adjust the initial OPC mask pattern and form a first updated OPC mask pattern;
  using the computing system, the OPC model, a DSA model, and the first updated OPC mask pattern, iteratively updating the first updated OPC mask pattern to generate a current iteration, updated OPC mask pattern and current iteration, simulated DSA patterns;

using the computing system, determining a root mean square of edge placement errors that are correspondingly defined by differences between edge positions of the current iteration, simulated DSA patterns and the DSA target patterns; and using the computing system, comparing the root mean square of the edge placement errors to a predetermined root mean square edge placement error value, and if the root mean square of the edge placement errors is less than the predetermined root mean square edge placement error value, then outputting the current iteration, updated OPC mask pattern.

* * * * *